(12) United States Patent
Gunamony

(10) Patent No.: US 7,605,588 B2
(45) Date of Patent: Oct. 20, 2009

(54) RF COIL ASSEMBLY

(75) Inventor: Shajan Gunamony, Bangalore (IN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 41 days.

(21) Appl. No.: 11/552,682

(22) Filed: Oct. 25, 2006

(65) Prior Publication Data

US 2007/0096738 A1 May 3, 2007

(30) Foreign Application Priority Data

Oct. 31, 2005 (JP) .............................. 2005-316187

(51) Int. Cl.
*G01V 3/00* (2006.01)
(52) U.S. Cl. .................. 324/318; 600/421; 600/422
(58) Field of Classification Search ................ 324/318, 324/322; 600/410, 421–422
See application file for complete search history.

(56) References Cited

U.S. PATENT DOCUMENTS

| | | | |
|---|---|---|---|
| 4,725,779 A | 2/1988 | Hyde et al. | |
| 5,166,618 A | 11/1992 | Jones et al. | |
| 5,256,972 A | 10/1993 | Keren et al. | |
| 5,278,505 A | 1/1994 | Arakawa | |
| 5,552,707 A * | 9/1996 | Takahashi et al. | 324/318 |
| 5,646,531 A * | 7/1997 | Renz | 324/318 |
| 5,804,969 A | 9/1998 | Lian et al. | |
| 6,414,488 B1 | 7/2002 | Chmielewski | |
| 6,504,369 B1 | 1/2003 | Varjo et al. | |
| 6,879,159 B2 * | 4/2005 | Yoshida | 324/318 |
| 6,930,480 B1 * | 8/2005 | Fujita et al. | 324/318 |
| 2003/0094948 A1 * | 5/2003 | Okamoto et al. | 324/318 |
| 2007/0146104 A1 * | 6/2007 | Lee | 335/4 |

FOREIGN PATENT DOCUMENTS

JP 2002119495 4/2002

* cited by examiner

*Primary Examiner*—Brij Shrivastrav
*Assistant Examiner*—Megann E Vaughn
(74) *Attorney, Agent, or Firm*—Armstrong Teasdale LLP

(57) ABSTRACT

The present invention aims to provide an RF coil assembly capable of eliminating the need for connecting and disconnecting an electric path at decoupling portions and is an RF coil assembly including: a plurality of coil loops that are adjacent to each other in sequence and construct a phased array; and a plurality of decoupling device that cancel electromagnetic coupling between adjacent coil loops, respectively, wherein at least two of the plurality of coil loops are two coil loops that are adjacent to each other across a boundary where they can be decoupled from each other, and wherein at least one of the plurality of decoupling device is two coils that are connected in series to the two coil loops, respectively, and are opposed to each other across the boundary and form a pair of coils for decoupling.

13 Claims, 7 Drawing Sheets

RF COIL ASSEMBLY

CROSS REFERENCE TO RELATED APPLICATIONS

This application claims the benefit of Japanese Application No. 2005-316187 filed Oct. 31, 2005.

BACKGROUND OF THE INVENTION

The present invention relates to an RF coil assembly (radio frequency coil assembly) and, in particular, to a phased array type RF coil assembly for an MRI (magnetic resonance imaging) apparatus.

In an MRI apparatus performing parallel imaging and the like, a magnetic resonance signal from an object is received by a plurality of RF coils. The signals received by the plurality of RF coils are received by a plurality of receivers.

The plurality of RF coils construct a phased array. In the phased array, there is provided a decoupling means in order to prevent the adjacent RF coils from being magnetically coupled to each other (refer to, for example, a patent document 1)

[Patent document 1] Japanese Unexamined Patent Publication No. 2002-119495 (pages 3 and 4, FIGS. 1 and 2)

In the case of constructing an RF coil assembly in the shape of a cylinder, in order to enhance a filling factor and at the same time to facilitate mounting and dismounting the RF coil assembly on and from an object, there are cases where the RF coil assembly can be decoupled, for example, in an anterior and posterior direction. In this case, it is desired to eliminate the need for connecting and disconnecting an electric path including a decoupling means at decoupling portions.

SUMMARY OF THE INVENTION

Therefore, an object of the present invention is to realize an RF coil assembly that eliminates the need for connecting and disconnecting an electric path at decoupling portions.

The present invention to solve the above problem is an RF coil assembly including: a plurality of coil loops that are adjacent to each other in sequence and construct a phased array; and a plurality of decoupling means that cancel electromagnetic coupling between adjacent coil loops, respectively, and characterized in that at least two of the plurality of coil loops are two coil loops that are adjacent to each other across a boundary where they can be decoupled from each other, and in that at least one of the plurality of decoupling means is two coils that are connected in series to the two coil loops and are opposed to each other across the boundary and form a pair of coils for decoupling.

It is preferable in terms of decoupling the RF coil assembly into two parts that two of the plurality of coil loops are two coil loops that are adjacent to each other across a first boundary where they can be decoupled from each other and form a first pair of coil loops, that one of the plurality of decoupling means is two coils that are respectively connected in series to the two coil loops forming the first pair of coil loops, and are opposed to each other across the first boundary and form a first pair of coils for decoupling, that other two of the plurality of coil loops are two coil loops that are adjacent to each other across a second boundary where they can be decoupled from each other and form a second pair of coil loops, and that another of the plurality of decoupling means is two coils that are respectively connected in series to the two coil loops forming the second pair of coil loops, and are opposed to each other across the second boundary and form a second pair of coils for decoupling.

It is preferable in terms of decoupling the RF coil assembly into the respective coil loops that all of the remainder of the plurality of coil loops are coil loops that are adjacent to each other across a boundary where they can be decoupled from each other, and that the all of the remainder of the plurality of decoupling means are two coils that are respectively connected in series to the two coil loops forming the pair of coil loops, and are opposed to each other across the boundary and form a pair of coils for decoupling.

It is preferable in terms of carrying out decoupling with ease that a decoupling means except the pair of coils for decoupling is two coils that are connected in series to two adjacent coil loops, respectively, and are opposed to each other and form a pair of coils for decoupling.

It is preferable in terms of eliminating the need for providing a coil for decoupling that a decoupling means except the pair of coils for decoupling is a decoupling means using an overlap between adjacent coil loops.

It is preferable in terms of constructing a cylindrical RF coil assembly that the plurality of coil loops are a plurality of coil loops that are adjacent to each other in sequence along a periphery of a cylinder.

According to the present invention, an RF coil assembly is an RF coil assembly including: a plurality of coil loops that are adjacent to each other in sequence and construct a phased array; and a plurality of decoupling means that cancel electromagnetic coupling between adjacent coil loops, respectively, wherein at least two of the plurality of coil loops are two coil loops that are adjacent to each other across a boundary where they can be decoupled from each other, and wherein at least one of the plurality of decoupling means is two coils that are connected in series to the two coil loops, respectively, and are opposed to each other across the boundary and form a pair of coils for decoupling. As a result, it is possible to realize an RF coil assembly capable of eliminating the need for connecting and disconnecting an electric path at decoupling portions.

Further objects and advantages of the present invention will be apparent from the following description of the preferred embodiments of the invention as illustrated in the accompanying drawings.

DETAILED DESCRIPTION OF THE INVENTION

Figure 1:
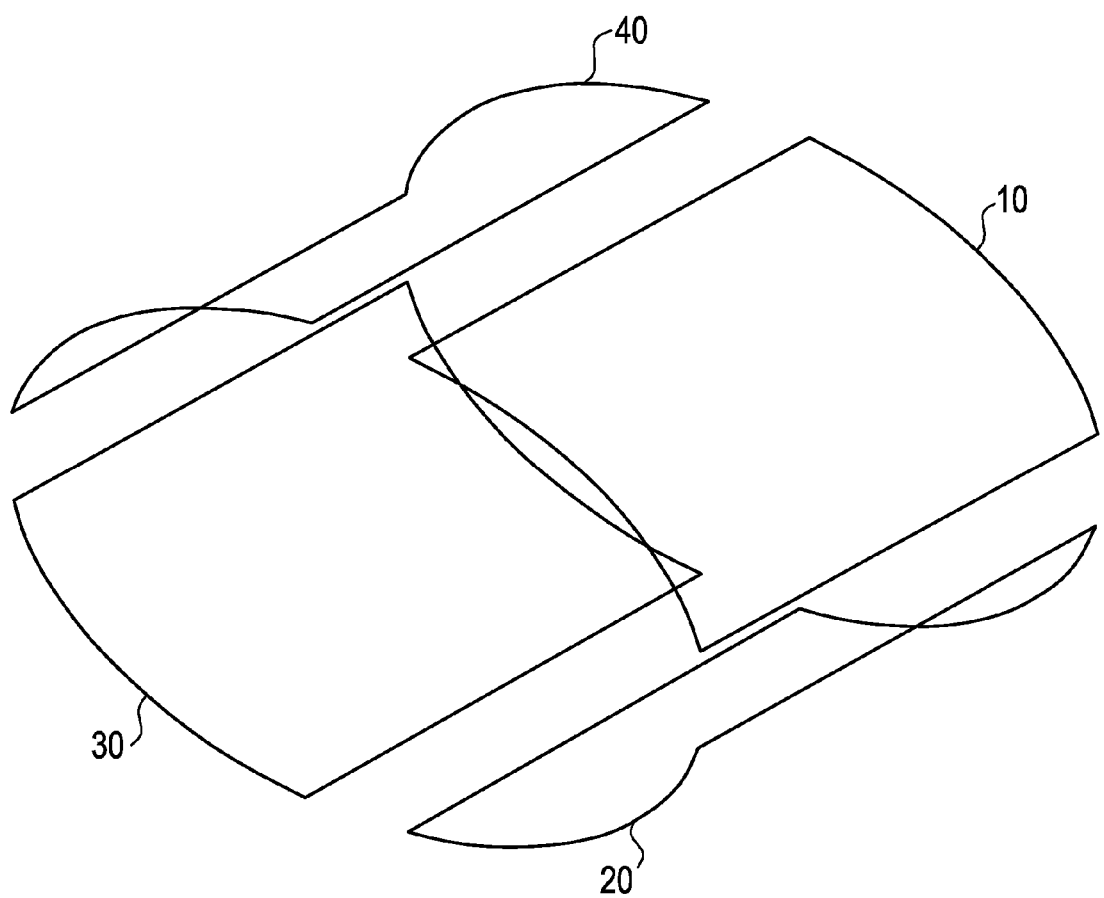
FIG. 1 is a diagram showing the basic construction of an RF coil assembly.

Hereinafter, the best mode for carrying out the present invention will be described in detail with reference to the drawings. In this regard, it is not intended to limit the present invention to the best mode for carrying out the present invention. The basic construction of an RF coil assembly is shown in FIG. 1. As shown in FIG. 1, the RF coil assembly has four coil loops 10, 20, 30, and 40. Each coil loop is actually constructed of an LCR circuit but is here simply expressed by the loop of a conductor, and ditto for the following.

Figure 2:
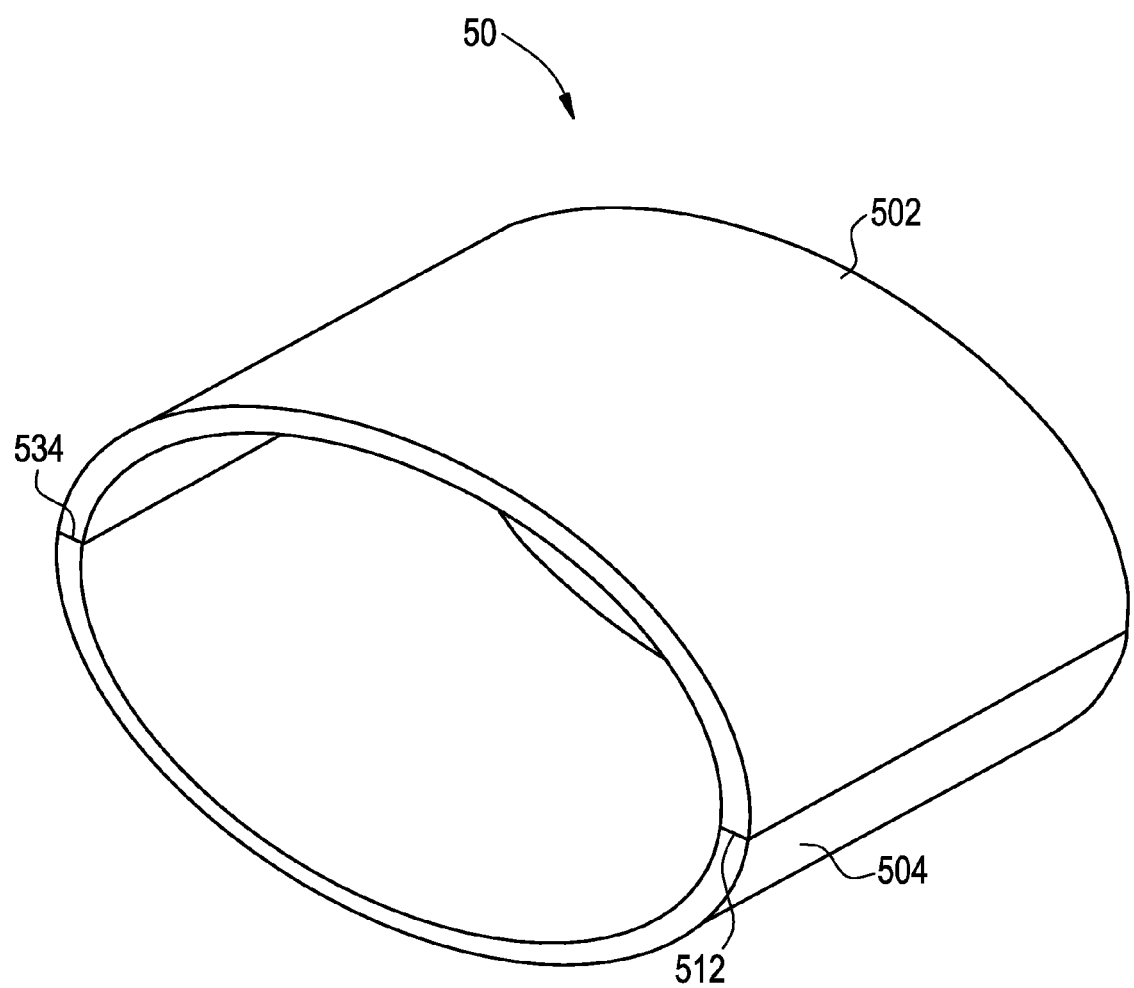
FIG. 2 is a diagram showing the construction of a supporting body of a coil loop.

The coil loops 10, 20, 30, and 40 are placed on a supporting body 50 shaped like an elliptic cylinder as shown in FIG. 2 in such a way as to be adjacent to each other in sequence along the periphery of the supporting body 50. The supporting body 50 is constructed of a combination of an anterior supporting body 502 shaped like a semi-elliptic cylinder and a posterior supporting body 504 shaped like a semi-elliptic cylinder.

The coil loops 10, 40 are supported by the anterior supporting body 502 and the coil loops 20, 30 are supported by the posterior supporting body 504. The anterior supporting body 502 and the posterior supporting body 504 can be coupled to and decoupled from each other at boundary portions 512, 534.

Figure 3:
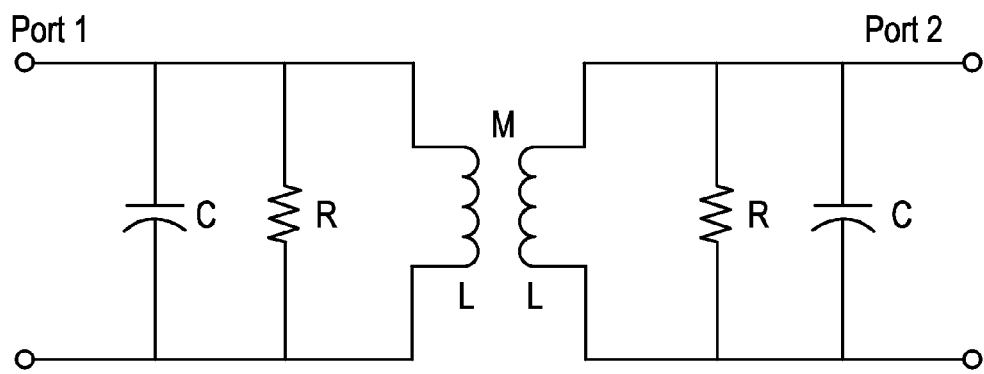
FIG. 3 is a diagram showing the equivalent circuit of an RF coil assembly that focuses attention on two adjacent coil loops.

The equivalent circuit of the RF coil assembly that focuses attention on two adjacent coil loops is shown in FIG. 3. As shown in FIG. 3, two coil loops typified by a port 1 and a port 2 are expressed by LCR circuits, respectively, and are electromagnetically coupled to each other by mutual induction M.

Figure 4:
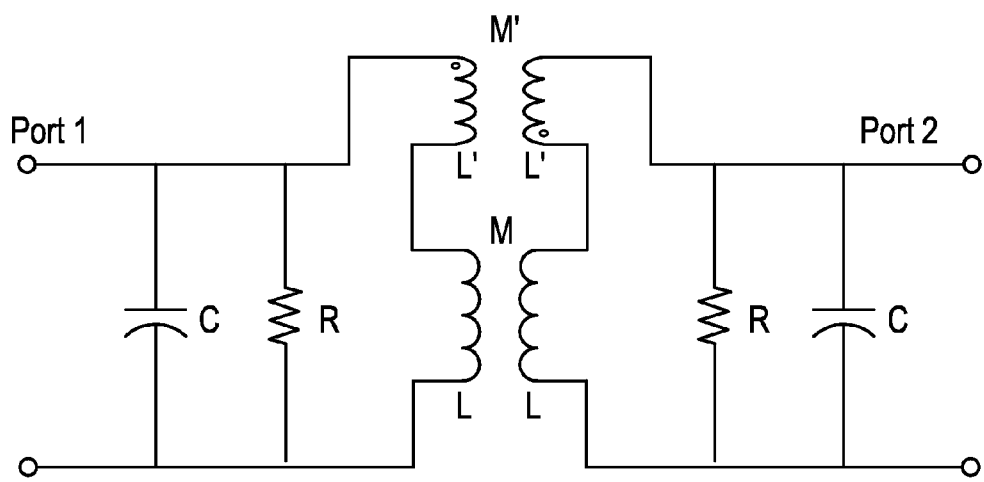
FIG. 4 is a diagram showing the equivalent circuit of two adjacent coil loops provided with a decoupling means.

In a phased array, there is provided a decoupling means so as to cancel this electromagnetic coupling. The equivalent circuit of two coil loops provided with the decoupling means is shown in FIG. 4. As shown in FIG. 4, inductors L', L' as a decoupling means are added to two coil loops and the electromagnetic coupling by the mutual induction M is cancelled by the use of the mutual induction M' of opposite polarity between the inductors.

Figure 5:
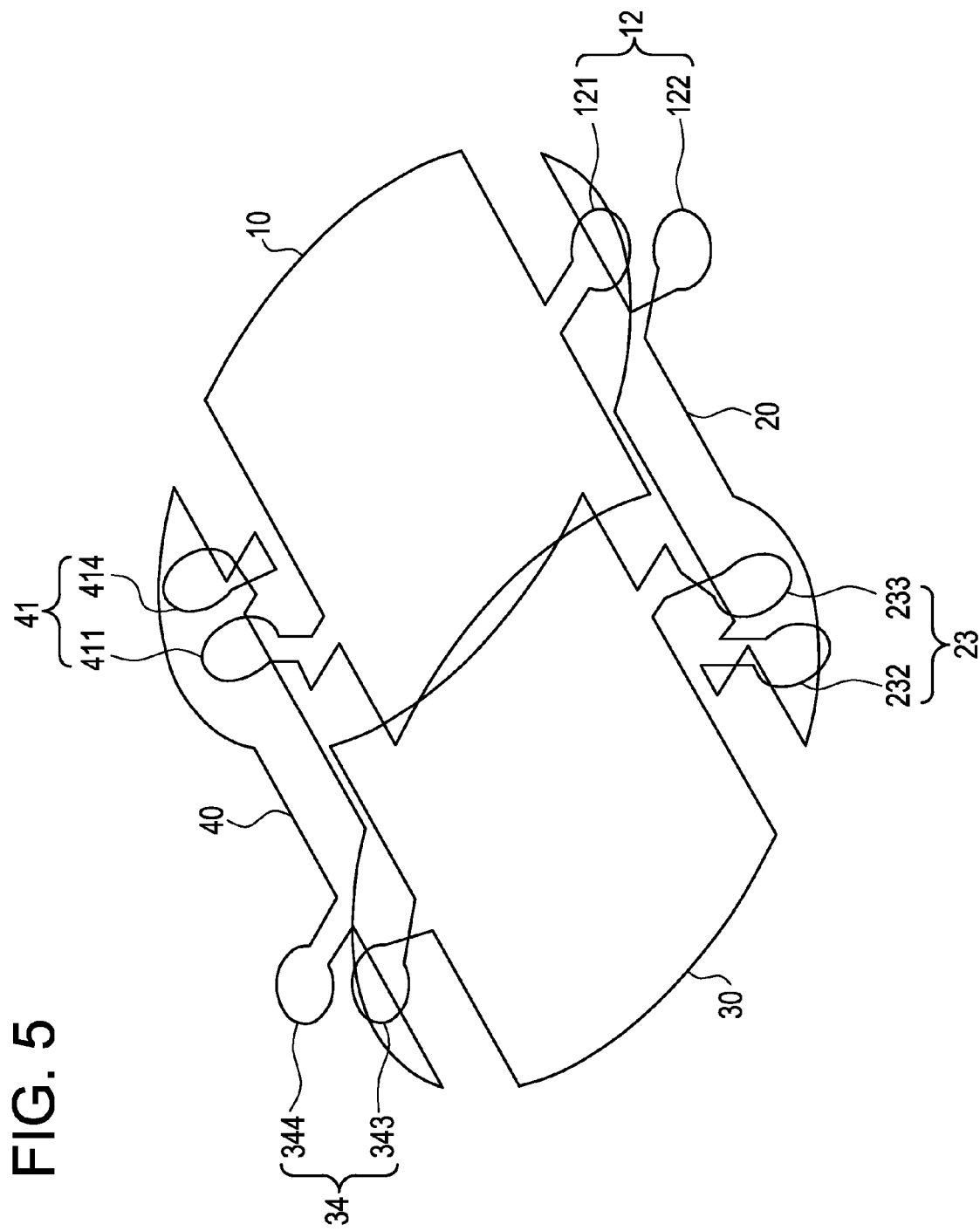
FIG. 5 is a diagram showing the construction of an RF coil assembly that is one example of the best mode for carrying out the present invention.

In FIG. 5 is shown the schematic construction of an RF coil assembly having a decoupling means. This RF coil assembly is one example of the best mode for carrying out the present invention. One example of the best mode for carrying out the present invention relating to an RF coil assembly is shown by the construction of this RF coil assembly.

This RF coil assembly corresponds to an RF coil assembly in which in the basic construction shown in FIG. 1, a decoupling means is added to the coil loops 10, 20, 30, and 40. The respective coil loops of this RF coil assembly are also placed on the decoupling type supporting body 50 shaped like an elliptic cylinder as shown in FIG. 2 in such a way as to be adjacent to each other in sequence along its periphery.

That is, the coil loops 10, 40 are supported by the anterior supporting body 502 and the coil loops 20, 30 are supported by the posterior supporting body 504. With this, the coil loops 10, 40 are placed on an anterior side and the coil loops 20, 30 are placed on a posterior side. Each of the coil loops 10, 20, 30, and 40 is one example of the coil loop in the present invention.

The decoupling of the coil loop 10 from the coil loop 20 is carried out by a decoupling means 12. The decoupling means 12 is constructed of a coil 121 provided in series to the coil loop 10 and a coil 122 provided in series to the coil loop 20.

The coil 121 and the coil 122 are opposed to each other in a direction perpendicular to the central axis of the supporting body 50 in a state where their coil planes are horizontal. Both coils are opposite to each other in winding directions and hence develop mutual induction of opposite polarity. Here, each of the coils 121, 122 is shown as a coil of one turn, but each of them can have an appropriate number of turns, ditto for the following.

The decoupling of the coil loop 20 from the coil loop 30 is carried out by a decoupling means 23. The decoupling means 23 is constructed of a coil 232 provided in series to the coil loop 20 and a coil 233 provided in series to the coil loop 30.

The coil 232 and the coil 233 are opposed to each other in a direction parallel to the central axis of the supporting body 50 in a state where their coil planes are vertical. Both coils are opposite to each other in winding directions and hence develop mutual induction of opposite polarity.

The decoupling of the coil loop 30 from the coil loop 40 is carried out by a decoupling means 34. The decoupling means 34 is constructed of a coil 343 provided in series to the coil loop 30 and a coil 344 provided in series to the coil loop 40.

The coil 343 and the coil 344 are opposed to each other in a direction perpendicular to the central axis of the supporting body 50 in a state where their coil planes are horizontal. Both coils are opposite to each other in winding directions and hence develop mutual induction of opposite polarity.

The decoupling of the coil loop 40 from the coil loop 10 is carried out by a decoupling means 41. The decoupling means 41 is constructed of a coil 414 provided in series to the coil loop 40 and a coil 411 provided in series to the coil loop 10.

The coil 414 and the coil 411 are opposed to each other in a direction parallel to the central axis of the supporting body 50 in a state where their coil planes are vertical. Both coils are opposite to each other in winding directions and hence develop mutual induction of opposite polarity.

The decoupling means 12, 23, 34, and 41 are examples of the decoupling means in the present invention. The coils 121, 122, 232, 233, 343, 344, 414, and 411 are examples of the coil for decoupling in the present invention.

A boundary portion 512 between the anterior supporting body 502 and the posterior supporting body 504 is between the coil loops 10 and 20. For this reason, the coils 121, 122 constructing the decoupling means 12 between the coil loops 10 and 20 are opposed to each other across the boundary portion 512. The boundary portion 512 is one example of a boundary where the coil loops can be decoupled from each other in the present invention and one example of a first boundary.

A boundary portion 534 between the anterior supporting body 502 and the posterior supporting body 504 is between the coil loops 30 and 40. For this reason, the coils 343, 344 constructing the decoupling means 34 between the coil loops 30 and 40 are opposed to each other across the boundary portion 534. The boundary portion 534 is one example of a boundary where the coil loops can be decoupled from each other in the present invention and one example of a second boundary.

This construction eliminates the need for disconnecting an electric path when the RF coil assembly is decoupled into an anterior part and a posterior part. Moreover, this construction eliminates the need for connecting the electric path when the anterior part is coupled to the posterior part.

Figure 6:
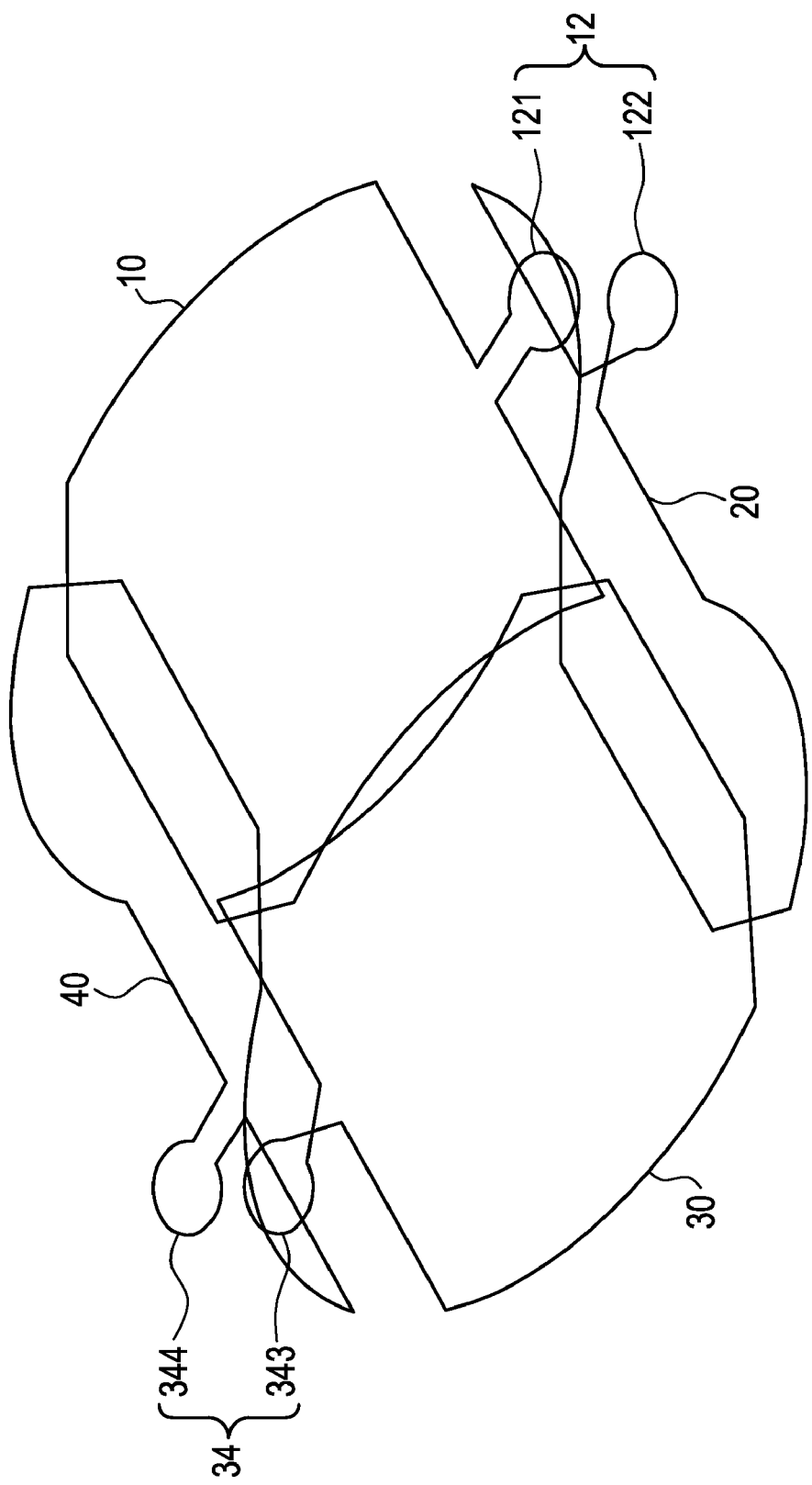
FIG. 6 is a diagram showing another example of an RF coil assembly.

Another example of the construction of an RF coil assembly is shown in FIG. 6. In this RF coil assembly, a partial overlap of coil loops 40 and 10 is used as a decoupling means between the coil loops 40 and 10, and a partial overlap of coil loops 20 and 30 is used as a decoupling means between the coil loops 20 and 30. Except this construction, this RF coil assembly is the same as the RF coil assembly shown in FIG. 5. Even this construction can eliminate the need for disconnecting an electric path when the RF coil assembly is decoupled into an anterior part and a posterior part and can eliminate the need for connecting the electric path when the anterior part is coupled to the posterior part. Further, this construction is preferable in terms of eliminating the need for providing a coil for decoupling between the coil loops 40 and 10 and a coil for decoupling between the coil loops 20 and 30.

Figure 7:
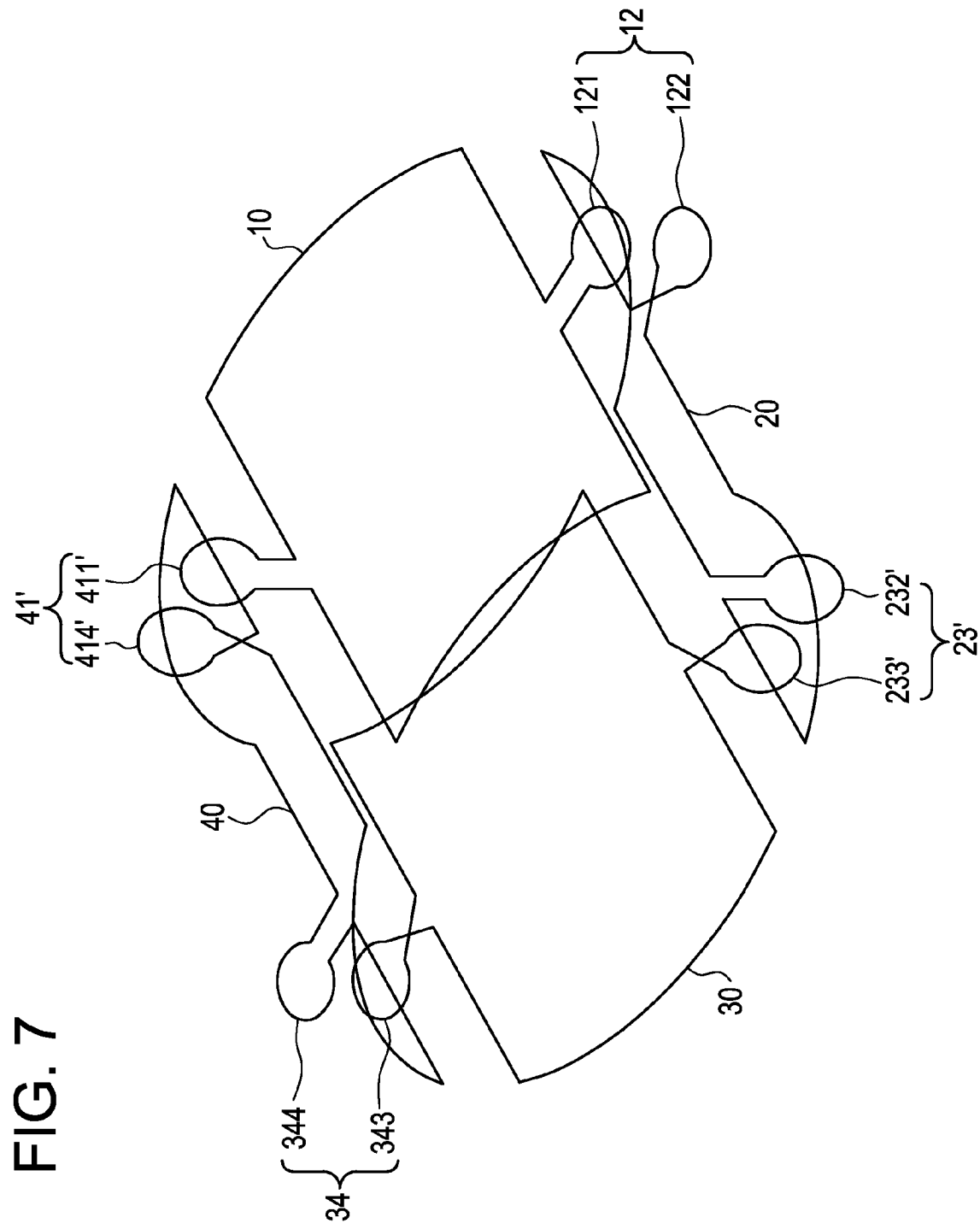
FIG. 7 is a diagram showing still another example of an RF coil assembly.

Still another example of the construction of an RF coil assembly is shown in FIG. 7. In this RF coil assembly, the decoupling of the coil loop 20 from the coil loop 30 is carried out by a decoupling means 23'. The decoupling means 23' is constructed of a coil 232' provided in series to the coil loop 20 and a coil 233' provided in series to the coil loop 30.

The coil 232' and the coil 233' are opposed to each other in a direction perpendicular to the central axis of the supporting body 50 in a state where their coil planes are vertical. Both coils are opposite to each other in winding directions and hence develop mutual induction of opposite polarity.

The decoupling of the coil loop 40 from the coil loop 10 is carried out by a decoupling means 41'. The decoupling means 41' is constructed of a coil 414' provided in series to the coil loop 40 and a coil 411' provided in series to the coil loop 10.

The coil 414' and the coil 411' are opposed to each other in a direction perpendicular to the central axis of the supporting body 50 in a state where their coil planes are vertical. Both coils are opposite to each other in winding directions and hence develop mutual induction of opposite polarity.

Except this construction, this coil assembly is the same as the RF coil assembly shown in FIG. 5. Even this construction can eliminate the need for disconnecting an electric path when the RF coil assembly is decoupled into an anterior part and a posterior part and can eliminate the need for connecting the electric path when the anterior part is coupled to the posterior part.

Figure 8:
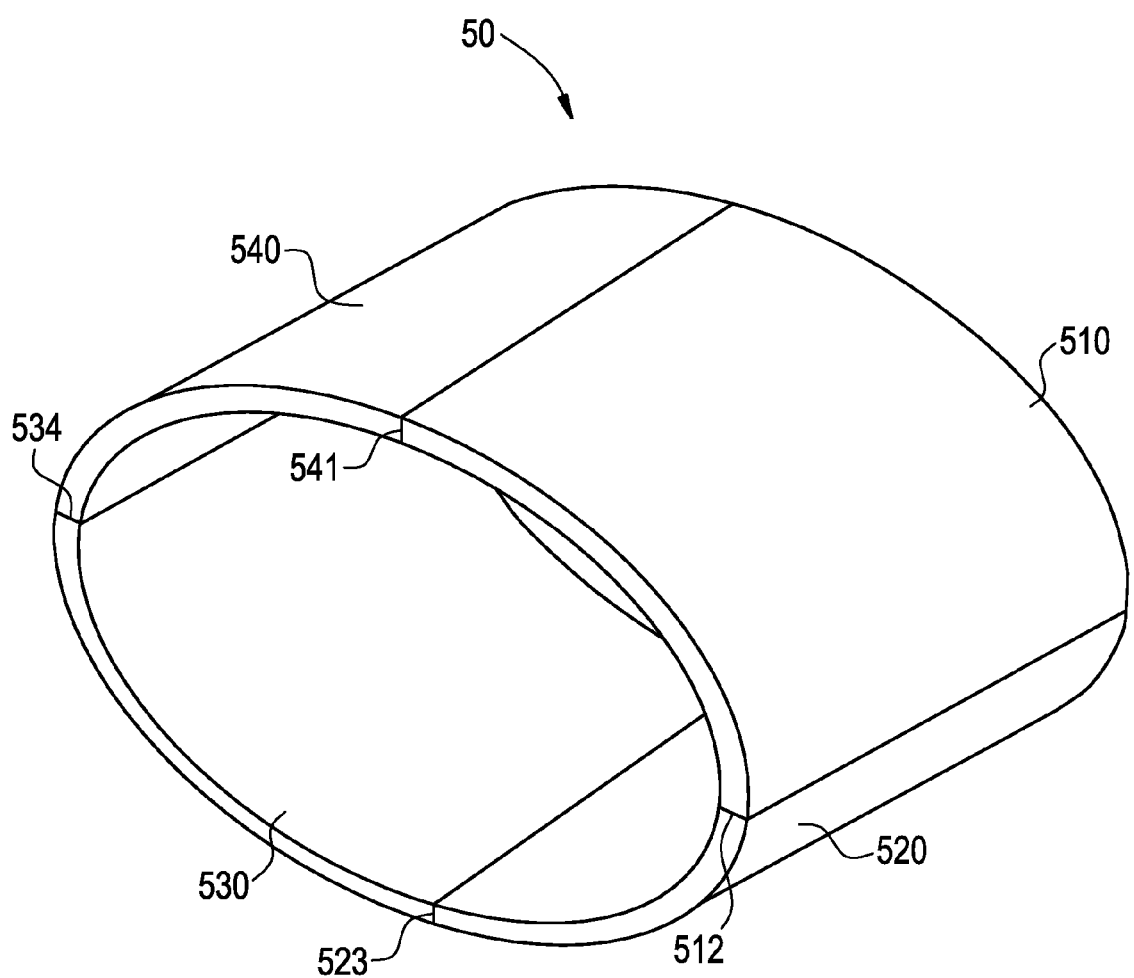
FIG. 8 is a diagram showing the construction of a supporting body of a coil loop.

Moreover, as shown in FIG. 8, this construction can eliminate the need for connecting and disconnecting the electric path even when the supporting body 50 can be decoupled into the respective coil loops at the boundary portions 512, 523, 534, and 541.

While examples of the RF coil assembly having four coil loops have been described above, the number of the coil loops is not limited to four but may be an appropriate plural number. Moreover, the cylindrical supporting body for supporting the plurality of coil loops is not limited to being elliptic in cross section but may be circular or appropriately polygonal in cross section.

Many widely different embodiments of the invention may be configured without departing from the spirit and the scope of the present invention. It should be understood that the present invention is not limited to the specific embodiments described in the specification, except as defined in the appended claims.

The invention claimed is:

1. A radio frequency (RF) coil assembly comprising:
 a phased array comprising a plurality of RF coils, said plurality of RF coils comprising:
  a plurality of coil loops in sequence defining a circumference; and
  a plurality of decoupling devices configured to cancel an electromagnetic coupling between adjacent coil loops of said plurality of coil loops, said plurality of decoupling devices positioned about the circumference,
  wherein at least two coil loops of said plurality of coil loops are adjacent to each other across a boundary such that said at least two coil loops can be decoupled, and
  wherein at least one decoupling device of said plurality of decoupling devices comprises two coils connected in series to said at least two coil loops, and are opposed to each other across the boundary and form a pair of coils for decoupling; and
 an elliptical shaped supporting body having an exterior surface coupled to said phased array, said elliptical shaped supporting body comprising:
  a semi-elliptical shaped anterior supporting body portion; and
  a semi-elliptical shaped posterior supporting body portion that is removably coupled to said anterior supporting body portion, said anterior and posterior supporting body portions configured to support said plurality of RF coils.

2. An RF coil assembly in accordance with claim 1, wherein said phased array comprises a first RF coil, a second RF coil disposed adjacent to said first RF coil, and a first decoupling apparatus configured to cancel an electromagnetic field between said first and second RF coils.

3. An RF coil assembly in accordance with claim 2, wherein said phased array further comprises a third RF coil, a fourth RF coil disposed adjacent to said third RF coil, and a second decoupling apparatus configured to cancel an electromagnetic field between said third and fourth RF coils.

4. An RF coil assembly in accordance with claim 3, wherein said phased array further comprises:
 a third decoupling apparatus configured to cancel an electromagnetic field between said second and said third RF coils; and
 a fourth decoupling apparatus configured to cancel an electromagnetic field between said first and said fourth RF coils.

5. An RF coil assembly in accordance with claim 4, wherein said first and said fourth RF coils are coupled to said anterior supporting body portion and said second and third RF coils are coupled to said posterior supporting body portion.

6. An RF coil assembly in accordance with claim 5, wherein at least one of said first, second, third, and fourth decoupling apparatuses comprises:
 a first coil; and
 a second coil, said first and second coils are disposed in a direction that is perpendicular to a central axis of said supporting body.

7. An RF coil assembly in accordance with claim 6, wherein said first coil comprises windings wound in a first direction and said second coil comprises windings wound in a second opposite direction to develop a mutual induction of opposite polarity between said first and second coils.

8. An RF coil assembly in accordance with claim 5, wherein at least one of said first, second, third, and fourth decoupling apparatuses comprises:
 a first coil; and
 a second coil, said first and second coils are disposed in a direction that is parallel to a central axis of said supporting body.

9. An RF coil assembly in accordance with claim 8, wherein said first coil comprises windings wound in a first direction and said second coil comprises windings wound in a second opposite direction to develop mutual induction of opposite polarity between said first and second coils.

10. An RF coil assembly in accordance with claim 1, wherein said phased array comprises a first RF coil, a second RF coil disposed adjacent to said first RF coil, a third RF coil disposed adjacent to said second RF coil, and a fourth RF coil disposed adjacent said first and third RF coils.

11. An RF coil assembly in accordance with claim 10, wherein said first RF coil, said second RF coil, said third RF coil, and said fourth RF coil each comprises an LCR circuit.

12. An RF coil assembly in accordance with claim 11, wherein said first RF coil is coupled to said second RF coil by a mutual inductance.

13. An RF coil assembly in accordance with claim 12, wherein said third RF coil is coupled to said fourth RF coil by a mutual inductance.

* * * * *